United States Patent
Cheng et al.

(10) Patent No.: US 10,079,302 B2
(45) Date of Patent: Sep. 18, 2018

(54) SILICON GERMANIUM FIN IMMUNE TO EPITAXY DEFECT

(71) Applicant: International Business Machines Corporation, Armonk, NY (US)

(72) Inventors: Kangguo Cheng, Schenectady, NY (US); Juntao Li, Cohoes, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/979,720

(22) Filed: Dec. 28, 2015

(65) Prior Publication Data

US 2017/0186868 A1 Jun. 29, 2017

(51) Int. Cl.

| H01L 21/8234 | (2006.01) |
|---|---|
| H01L 29/78 | (2006.01) |
| H01L 29/08 | (2006.01) |
| H01L 29/161 | (2006.01) |
| H01L 29/165 | (2006.01) |
| H01L 29/66 | (2006.01) |

(52) U.S. Cl.
CPC ...... *H01L 29/7848* (2013.01); *H01L 29/0847* (2013.01); *H01L 29/161* (2013.01); *H01L 29/165* (2013.01); *H01L 29/66545* (2013.01); *H01L 29/66803* (2013.01); *H01L 29/7851* (2013.01)

(58) Field of Classification Search
None
See application file for complete search history.

(56) References Cited

U.S. PATENT DOCUMENTS

| 4,835,112 A * | 5/1989 | Pfiester ............ H01L 21/22 257/344 |
|---|---|---|
| 5,360,749 A * | 11/1994 | Anjum ............ H01L 21/26506 257/E21.335 |
| 6,800,910 B2 | 10/2004 | Lin et al. |
| 7,078,299 B2 | 7/2006 | Maszara et al. |
| 7,993,999 B2 | 8/2011 | Basker et al. |
| 8,211,772 B2 | 7/2012 | Kavalieros et al. |
| 8,395,195 B2 | 3/2013 | Chang et al. |
| 8,900,973 B2 | 12/2014 | Berliner et al. |
| 9,000,498 B2 | 4/2015 | Morin |
| 2011/0024804 A1 | 2/2011 | Chang et al. |
| 2011/0068399 A1* | 3/2011 | Bryant ............ H01L 21/84 257/347 |
| 2012/0091528 A1 | 4/2012 | Chang et al. |

(Continued)

OTHER PUBLICATIONS

Liow, T., et al., "Investigation of silicon-germanium fins fabricated using germanium condensation on vertical compliant structures", Applied Physics Letters, Dec. 19, 2005, pp. 1-3, vol. 87, No. 262104.

*Primary Examiner* — Ali Naraghi
(74) *Attorney, Agent, or Firm* — Fleit Gibbons Gutman Bongini Bianco PL; Thomas S. Grzesik

(57) ABSTRACT

A method for forming a semiconductor structure includes forming at least one fin on a semiconductor substrate. The least one fin includes a semiconducting material. A gate is formed over and in contact with the at least one fin. A germanium comprising layer is formed over and in contact with the at least one fin. Germanium from the germanium comprising layer is diffused into the semiconducting material of the at least one fin.

8 Claims, 15 Drawing Sheets

(56) References Cited

U.S. PATENT DOCUMENTS

| | | | | |
|---|---|---|---|---|
| 2013/0161763 A1* | 6/2013 | Ando | ............... | H01L 29/78621 |
| | | | | 257/408 |
| 2013/0264639 A1* | 10/2013 | Glass | ............... | H01L 21/28512 |
| | | | | 257/335 |
| 2014/0151814 A1* | 6/2014 | Giles | ............... | H01L 21/823821 |
| | | | | 257/369 |
| 2014/0175543 A1* | 6/2014 | Glass | ............. | H01L 21/823431 |
| | | | | 257/337 |
| 2014/0353719 A1 | 12/2014 | Kim | | |
| 2015/0270349 A1* | 9/2015 | Cheng | .................. | H01L 29/161 |
| | | | | 257/9 |
| 2016/0148935 A1 | 5/2016 | Chen | | |
| 2016/0181403 A1* | 6/2016 | Xu | ....................... | H01L 29/785 |
| | | | | 438/283 |
| 2017/0141210 A1* | 5/2017 | Yang | .............. | H01L 21/823431 |

\* cited by examiner

SILICON GERMANIUM FIN IMMUNE TO EPITAXY DEFECT

BACKGROUND OF THE INVENTION

The present disclosure generally relates to the field of semiconductors, and more particularly relates to non-planar semiconductor devices comprising fins immune to epitaxy defects.

Silicon-germanium (SiGe) fin technology is being developed to enhance p-type field-effect transistor performance. Conventional SiGe fins generally rely on epitaxially growing SiGe on a silicon (Si) substrate. However, due to the fundamental constraint of critical thickness of epitaxial SiGe on Si, it has been found that SiGe fins formed by conventional epitaxy processes are usually susceptible to epitaxy defects.

SUMMARY OF THE INVENTION

In one embodiment, a method for forming a semiconductor structure is disclosed. The method comprises forming at least one fin on a semiconductor substrate. The least one fin comprises a semiconducting material. A dummy gate is formed over and in contact with the at least one fin. A germanium comprising layer is formed over and in contact with the at least one fin. Germanium from the germanium comprising layer is diffused into the semiconducting material of the at least one fin.

In another embodiment, a semiconductor structure is disclosed. The semiconductor structure comprises a substrate and at least one fin formed on the substrate. The at least one fin comprises a semiconducting material and germanium diffused into the semiconducting material. A gate stack formed in contact with the at least one fin. A source region and a drain region are formed on the at least one fin.

In yet another embodiment, an integrated circuit is disclosed. The integrated circuit comprises a semiconductor structure. The semiconductor structure comprises a substrate and at least one fin formed on the substrate. The at least one fin comprises a semiconducting material and germanium diffused into the semiconducting material. A gate stack formed in contact with the at least one fin. A source region and a drain region are formed on the at least one fin.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
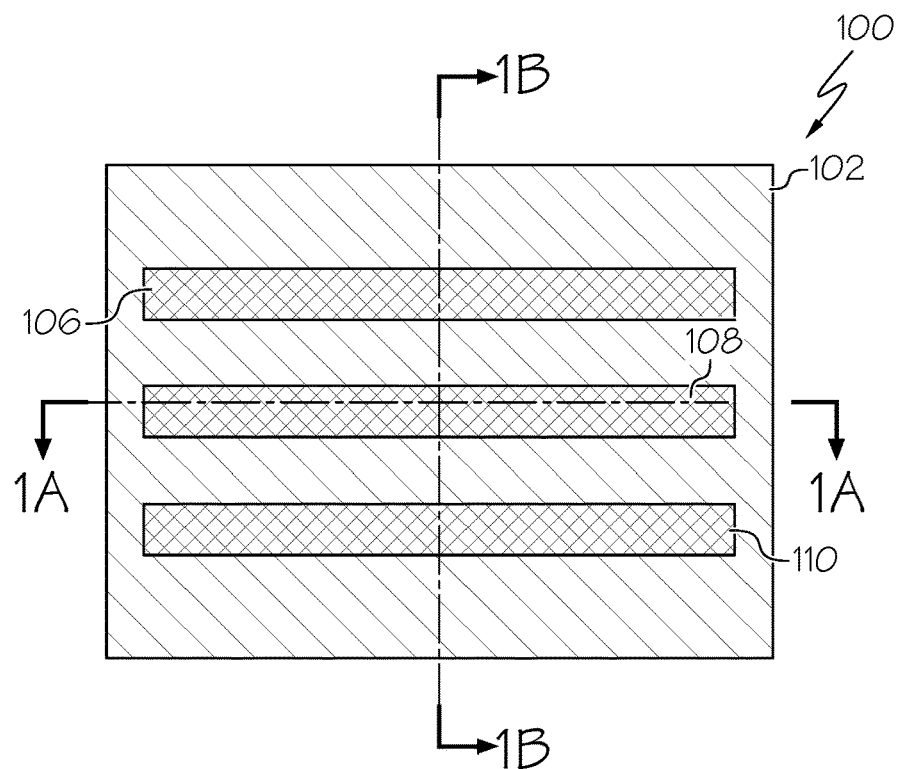
FIG. 1 is a top view of a semiconductor structure after a plurality of fins has been formed on a semiconductor substrate according one embodiment of the present disclosure.
Figure 1A:
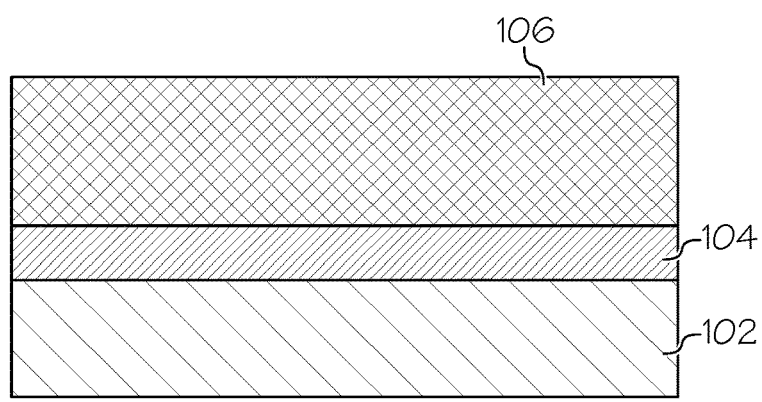
FIG. 1A is a view of the structure shown in FIG. 1 taken along a line that passes through a fin according one embodiment of the present disclosure.
Figure 1B:
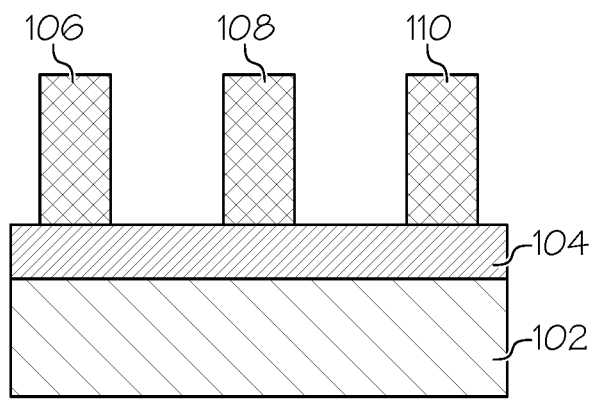
FIG. 1B is a cross-section view of the structure shown in FIG. 1 taken transverse to the long axis of the fins according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-7 illustrate various processes for fabricating a semiconductor fin structures that are immune to epitaxy defects. In general, the figures comprise a plain view and various cross-sectional views that are taken where indicated in the plain view. More specifically, the view "A" is taken along a line that passes through a fin, while views "B" and "C" are cross-section views that are taken transverse to the long axis of the fins.

It should be noted that one or more embodiments are not limited to the processes discussed below for forming the initial fin structures, gate structures, and completing the device(s) the device. This discussion is provided for illustration purposes, and any process for fabricating the initial fin structures, gate structures, and for completing the finFET device(s) is applicable to embodiments of the present disclosure.

FIG. 1 shows a semiconductor structure 100 that may be a part of a large semiconductor chip, for example, and is illustrated to include, among others, one or more three dimensional (3D) or fin-type field-effect-transistors (FETs) that are commonly known to include, for example, finFETs and tri-gate FETs. For the purpose of discussion hereinafter without losing generality, it is assumed and demonstratively illustrated that semiconductor structure 100 includes one or more finFETs (or finFET transistors), although the following discussion may be equally applied to tri-gate FETs with little or no modification.

In one embodiment, the semiconductor structure 100 comprises substrate 102 such as a silicon-on-insulator (SOI) substrate; a dielectric layer 104 (e.g., a BOX layer or oxide layer) overlying the substrate 102; and one or more fin structures 106, 108, 110 overlying the dielectric layer 104. The substrate layer 102 comprises at least one of Si, Ge alloys, SiGe, GaAs, InAs, InP, SiCGe, SiC, and other III/V or II/VI compound semiconductors. The fin structures 106, 108, 110 comprise a semiconductor material such as Si. The substrate layer 102 and the fin structures 106, 108, 110 can be made of the same or different materials. The dielectric layer 104, in one embodiment, is a crystalline or non-crystalline oxide, nitride, oxynitride, or any other insulating material.

In one embodiment, prior to forming the fin structures 106, 108, 110 the semiconductor material/layer can be formed utilizing a layer transfer process including a bonding step, or an implantation process such as SIMOX (Separation by IMplantation of OXygen). This semiconductor layer can be undoped or doped with either p-type or n-type dopants through ion implantation, plasma doping, or gas phase doping. P-type transistors are produced by doping the semiconductor layer 106 with elements from group III of the periodic table (e.g., boron, aluminum, gallium, or indium). As an example, the dopant can be boron in a concentration ranging from $1\times10E18$ atoms/cm3 to $2\times10E21$ atoms/cm3. N-type transistors are produced by doping the semiconductor layer with elements from group V of the periodic table (e.g., phosphorus, antimony, or arsenic). The following embodiments refer to p-type transistors.

The fins 106, 108, 110 are formed, in one embodiment, by forming an etch-stop capping layer onto the semiconductor layer through, for example, deposition. The etch-stop capping layer, in one embodiment, may be made of silicon-nitride although other material suitable in providing etch-stop function may be used as well. One or more fin structures 106, 108, 110 are subsequently formed or etched out of the semiconductor layer to be on top of oxide layer 104 through a process involving masking, using industry-standard lithographic techniques, and directionally etching the etch-stop capping layer and underneath semiconductor layer. The directional etching process, for example a reactive-ion-etching (RIE) process, stops on the dielectric layer 104. After the RIE etching process, the photo-resist mask used in the lithographic etching process may be removed, leaving the fin structures 106, 108, 110.

Figure 2:
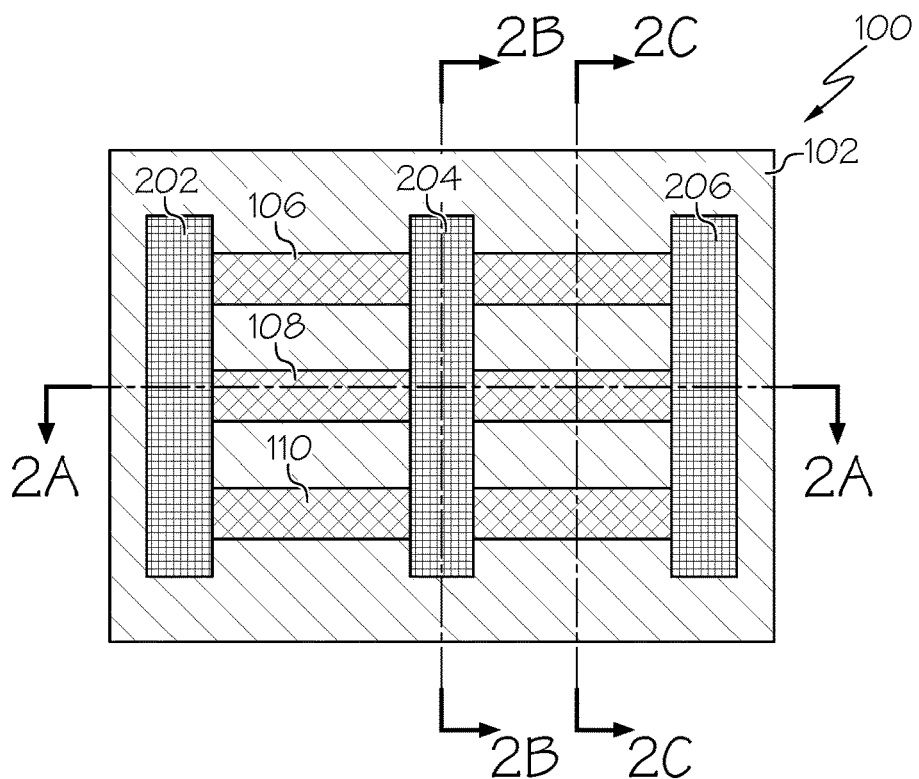
FIG. 2 is a top view of the semiconductor structure after a dummy gate has been formed on each of the plurality of fins according one embodiment of the present disclosure.
Figure 2A:
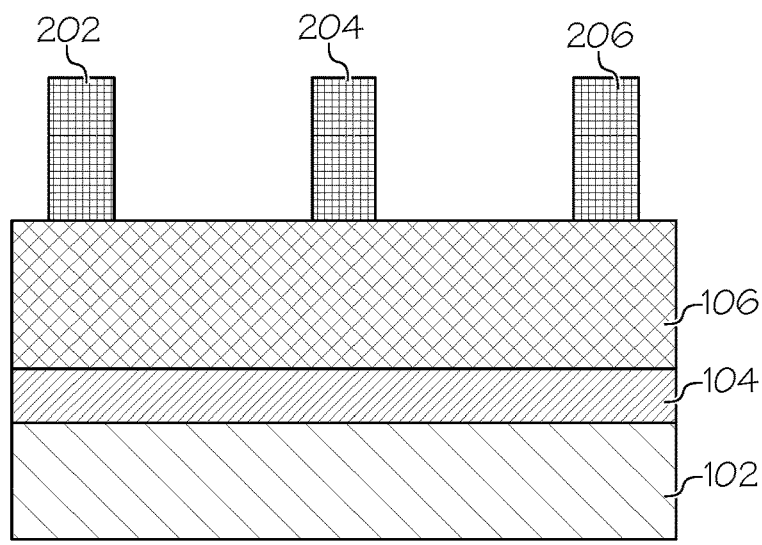
FIG. 2A is a view of the structure shown in FIG. 2 taken along a line that passes through a fin according one embodiment of the present disclosure.
Figure 2B:
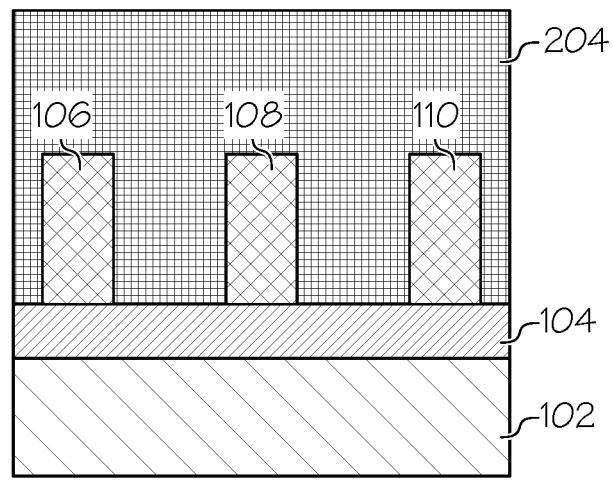
FIGS. 2B and 2C are cross-section views of the structure shown in FIG. 2 taken transverse to the long axis of the fins according one embodiment of the present disclosure.
Figure 2C:
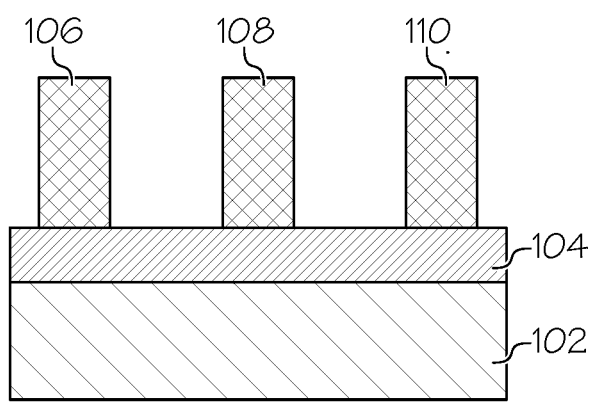

FIG. 2 shows that a replacement (dummy) gate 202, 204, 206 is formed on the fin structure 106, 108, 110. The dummy gate 202, 204, 206 is formed, in one embodiment, using oxide, polysilicon, amorphous silicon, nitride, or a combination thereof. In this example, the dummy is amorphous silicon. Depending on the material of the dummy gate 202, 204, 206, spacers (not shown) can then formed on the sidewalls of the dummy gates 202, 204, 206 by one or more spacer formation techniques. For example, if the material of the dummy gates 202, 204, 206 comprises amorphous silicon, sidewall spacers are required if the layer 302 is formed by epitaxial growth of high concentration of germanium containing material. The spacers can be formed by, for example, isotropically depositing a conformal layer of insulating material (e.g., silicon oxide, silicon nitride, silicon oxynitride, and high-k dielectric material and the like) followed by an anisotropic etch (e.g., reactive ion etch (RIE)) of that material to form spacers. In another embodiment, the dummy gates 202, 204, 206 can be amorphous silicon without sidewall spacers if the layer 302 is formed by any technique among the following: chemical vapor deposition, atomic layer deposition, plasma enhanced chemical vapor deposition, and gas cluster beam deposition. In another embodiment, the dummy gates 202, 204, 206 can be any type of dielectric materials (such as amorphous silicon, silicon oxide, silicon nitride, etc.) and no sidewall spacers are required if the layer 302 is formed by any technique among the following: chemical vapor deposition, atomic layer deposition, plasma enhanced chemical vapor deposition, and gas cluster beam deposition. It should be noted that the dummy gates discussed here can also be real gates formed using the "gate first" integration scheme.

An optional hard mask (not shown) can be formed on top of the dummy gate 202, 204, 206. The hard mask can comprise a dielectric material such as a nitride, oxide, oxynitride material, and/or any other suitable dielectric layer. The dielectric hard mask can be a single layer of dielectric material or multiple layers of dielectric materials, and can be formed by a deposition process such as chemical vapor deposition (CVD) and/or atomic layer deposition (ALD). Alternatively, the hard mask can be grown, such as through thermal oxidation or thermal nitridation.

Figure 3:
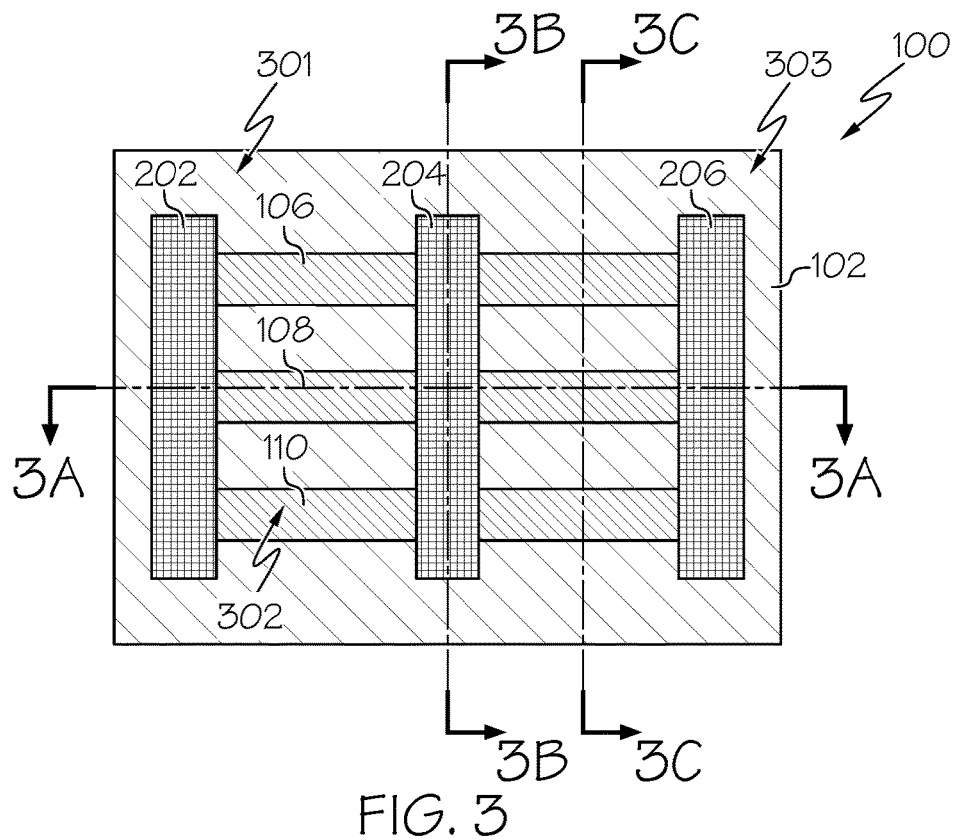
FIG. 3 is a top view of the semiconductor structure after a germanium comprising layer has been formed on portions of each the plurality of fins not underlying the dummy gates according one embodiment of the present disclosure.
Figure 3A:
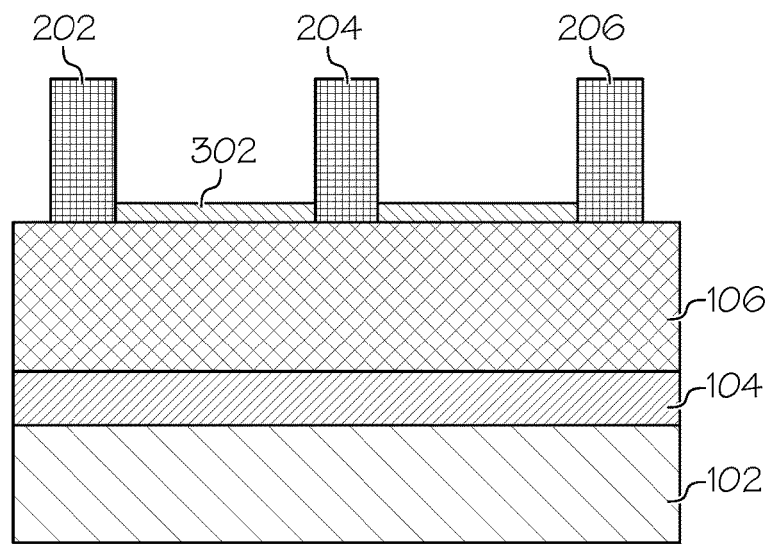
FIG. 3A is a view of the structure shown in FIG. 3 taken along a line that passes through a fin according one embodiment of the present disclosure.
Figure 3B:
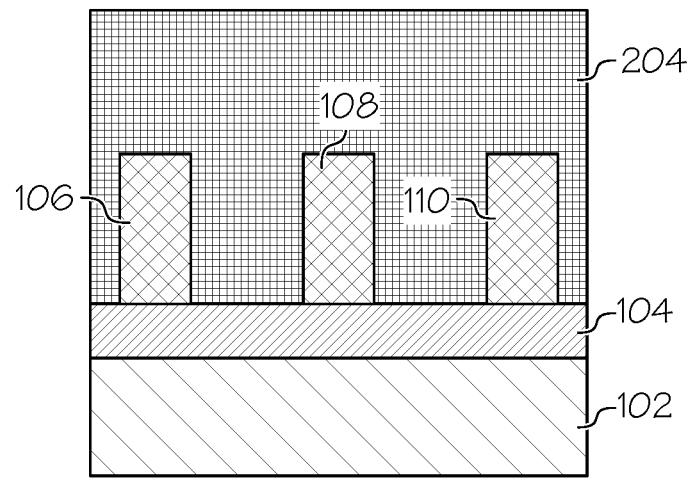
FIGS. 3B and 3C are cross-section views of the structure shown in FIG. 3 taken transverse to the long axis of the fins according one embodiment of the present disclosure.
Figure 3C:
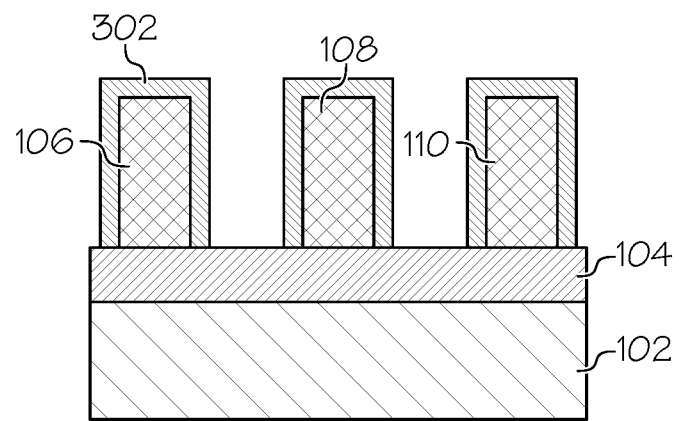

A layer 302 of material comprising germanium (Ge) is then deposited on and in contact with the fin structures 106, 108, 110 in the source and drain areas 301, 303 of the device 100, as shown in FIG. 3. The layer 302, in one embodiment, comprises SiGe with a high percentage of Ge such as 20% to 100% (e.g., pure germanium). These materials can be deposited/formed on the fin structures 106, 108, 110 by low temperature chemical vapor deposition (CVD), atomic layer deposition, plasma enhanced chemical vapor deposition (PECVD), gas cluster beam deposition, molecular beam epitaxy growth techniques.

Figure 4:
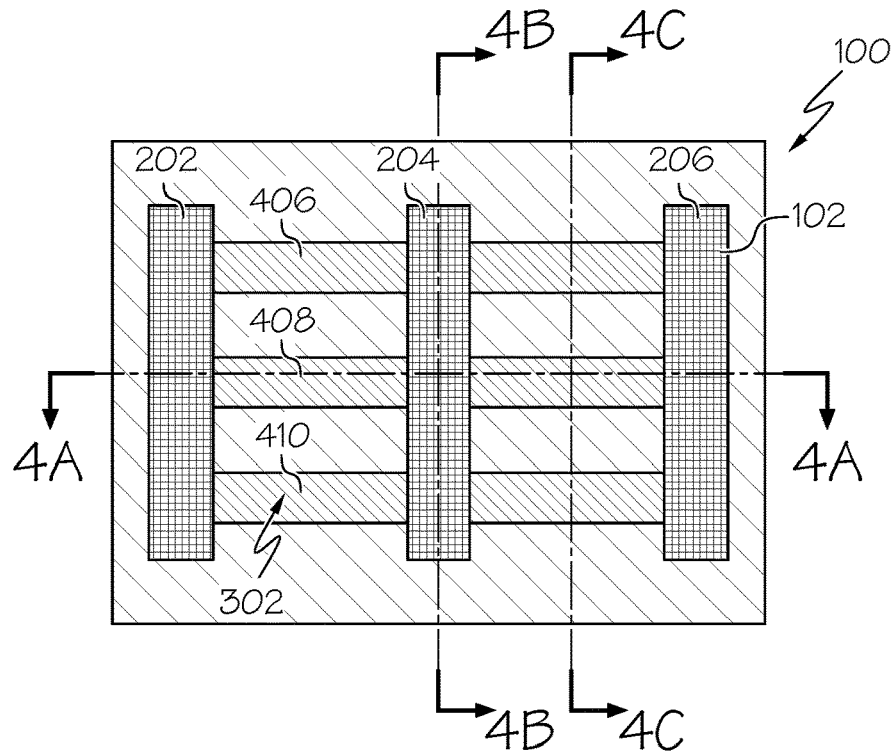
FIG. 4 is a top view of the semiconductor structure after a germanium from the germanium comprising layer has been diffused into each the plurality of fins according one embodiment of the present disclosure.
Figure 4A:
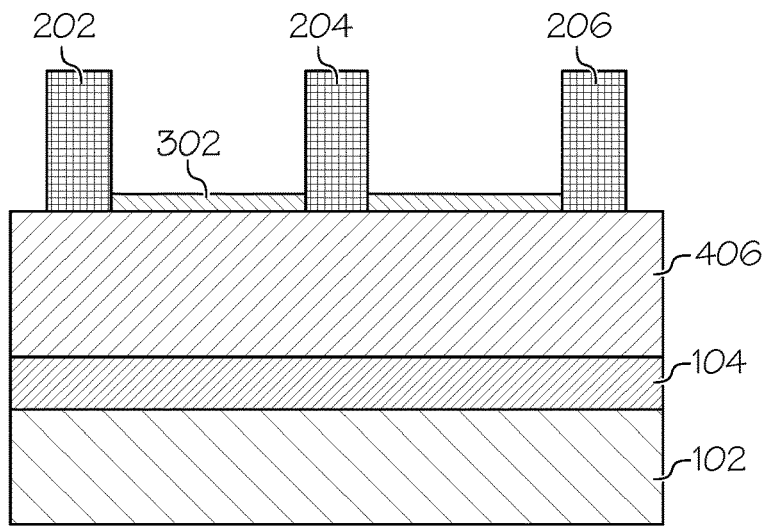
FIG. 4A is a view of the structure shown in FIG. 4 taken along a line that passes through a fin according one embodiment of the present disclosure.
Figure 4B:
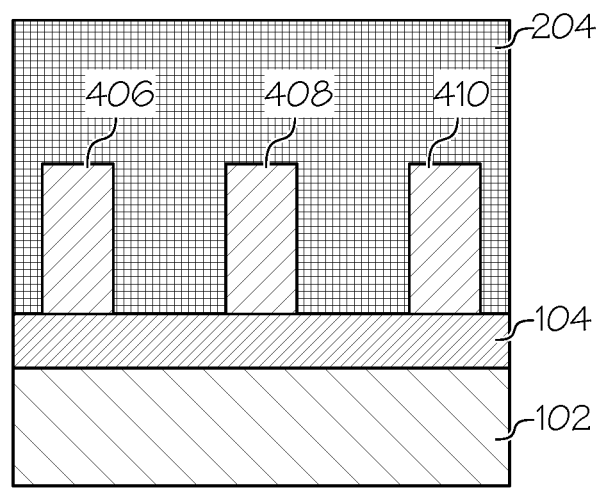
FIGS. 4B and 4C are cross-section views of the structure shown in FIG. 4 taken transverse to the long axis of the fins according one embodiment of the present disclosure.
Figure 4C:
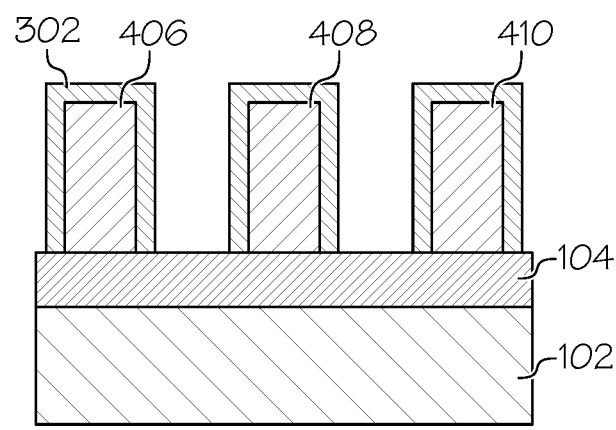

One or more processes are then utilized to diffuse Ge from layer 302 into the Si fins 106, 108, 110 to form SiGe fins 406, 408, 410, as shown in FIG. 4. For example, a thermal annealing treatment can be utilized to cause diffusion of germanium atoms from layer 302 into the Si fins 106, 108, 110, and particularly into the channel region form a SiGe channel. This process allows the Si fins 106, 108, 110 to become SiGe fins without experiencing defects caused by conventional epitaxy processes. The thermal treatment may be conducted by any method known in the art, for example, rapid thermal annealing (RTA) of the p-FET device 100. At this point of the manufacturing process, there may be no thermal budget constraint and a high temperature furnace anneal may be used to ensure a homogeneous distribution of germanium atoms in the silicon fin 120. Stated differently, both the silicon fin SiGe fins 106, 108, 110 and the germanium comprising/containing layer 302 may have a homogenous distribution of germanium atoms after the device 100 undergoes the thermal annealing treatment.

The thermal diffusion process may be performed at a temperature high enough to cause diffusion of germanium atoms out of layer 302 and into the Si fins 106, 108, 110. In one embodiment, the annealing temperature may range from about 800° C. to about 1250° C. and the process is performed in an inert environment (e.g., nitrogen or argon). The inter-diffusion of silicon and germanium atoms between the layer 302 and the Si fins 106, 108, 110 forms SiGe fins 406, 408, 410 and in turn a SiGe channel. Inter-diffusion may occur when germanium atoms, activated by the high annealing temperature, migrate from a region containing a high germanium concentration (such as layer 302) to a region of low (or zero) concentration of germanium atoms (such as the Si fins 106, 108, 110).

In general, the initial concentration of germanium atoms in layer 302, the annealing temperature and time determines the amount of germanium atoms diffusing into the Si fins 106, 108, 110 and particularly into the channel region during the thermal treatment. In one embodiment, the atomic concentration of germanium in the SiGe fins 406, 408, 410 and channel after thermal diffusion may range from about 15% to about 45%. The epitaxial thickness of the SiGe in the fins 406, 408, 410 ranges from, for example, 2 nm to 10 nm. As previously discussed, the final concentration of germanium atoms in the SiGe fins 406, 408, 410 and channel is proportional to the initial germanium concentration of the layer 302.

Figure 5:
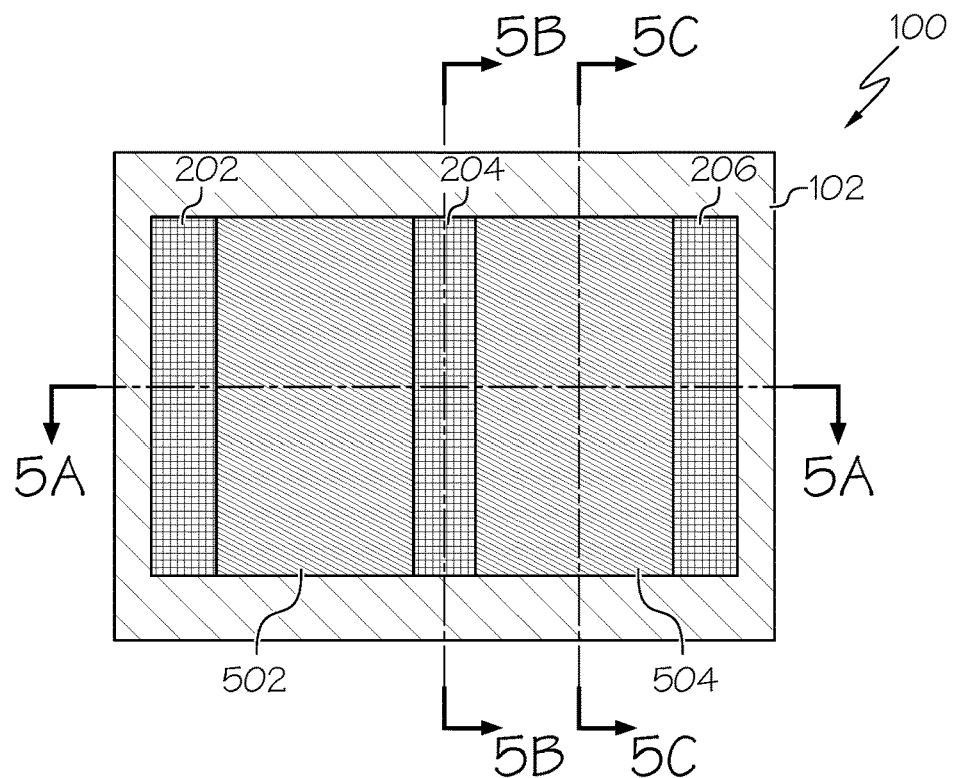
FIG. 5 is a top view of the semiconductor structure after the dummy gates have been removed according one embodiment of the present disclosure.
Figure 5A:
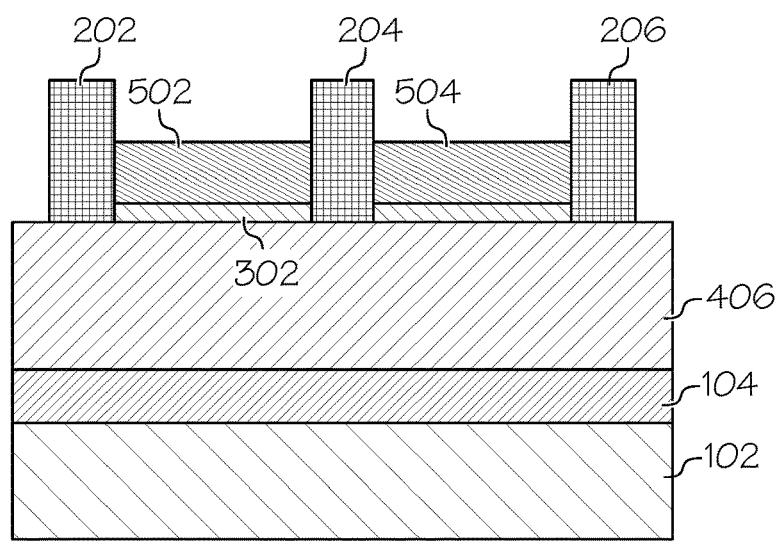
FIG. 5A is a view of the structure shown in FIG. 5 taken along a line that passes through a fin according one embodiment of the present disclosure.
Figure 5B:
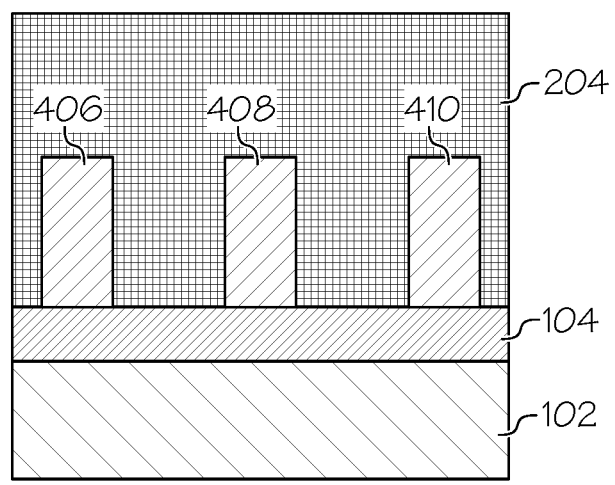
FIGS. 5B and 5C are cross-section views of the structure shown in FIG. 5 taken transverse to the long axis of the fins according one embodiment of the present disclosure.
Figure 5C:
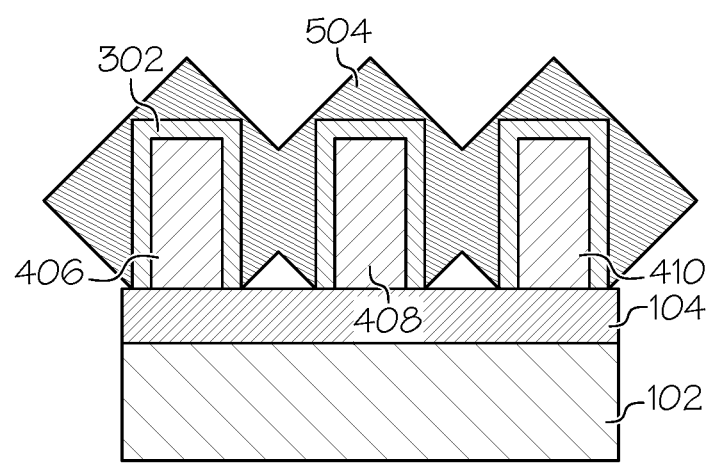

After the SiGe fins 406, 408, 410 have been formed, epitaxial source/drains 502, 504 are formed, as shown in FIG. 5. In one embodiment, the source and drain regions 502, 504 of a PFET device(s) are formed from in-situ boron doped (ISBD) silicon germanium (SiGe). Namely, boron is introduced during growth of a SiGe epitaxial material in the source and drain regions of the PFET device. Prior to the epitaxial growth of silicon germanium, a pre-cleaning wet process may be performed to remove the excess layer 302 of material consisting germanium on the surface of dummy gate and the sidewall spacers. After the epitaxial source drain formation, an inter-layer dielectric (ILD) layer is deposited and followed by chemical mechanical planarization (CMP) process. The CMP process stops at the nitride cap (not shown) of the dummy gates 202, 204, 206.

Figure 6:
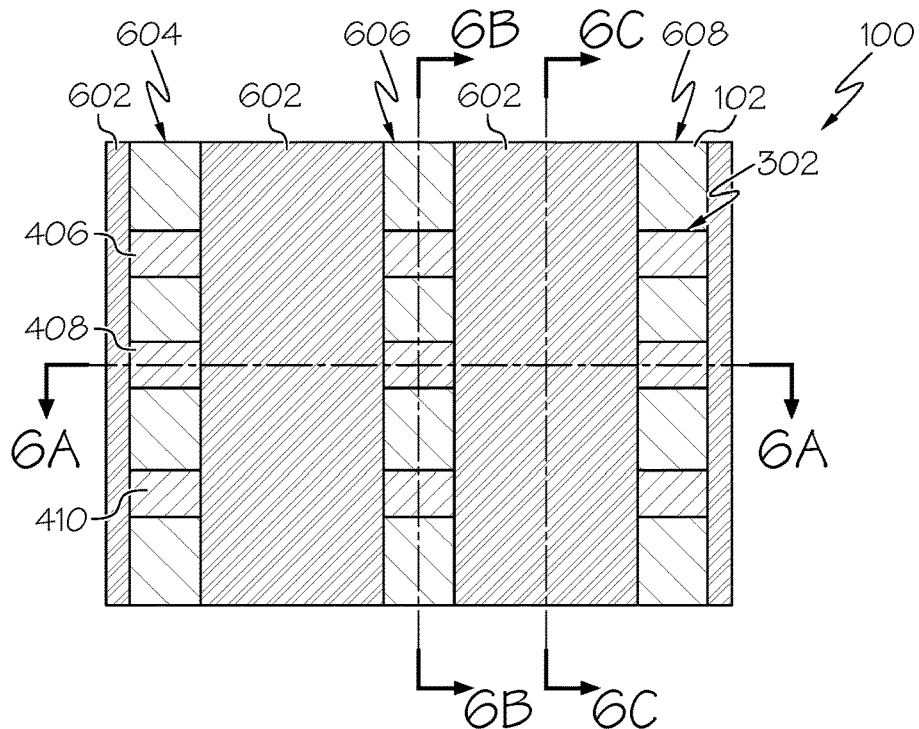
FIG. 6 is a top view of the semiconductor structure after a gate stack has been formed on each of the plurality of fins according one embodiment of the present disclosure.
Figure 6A:
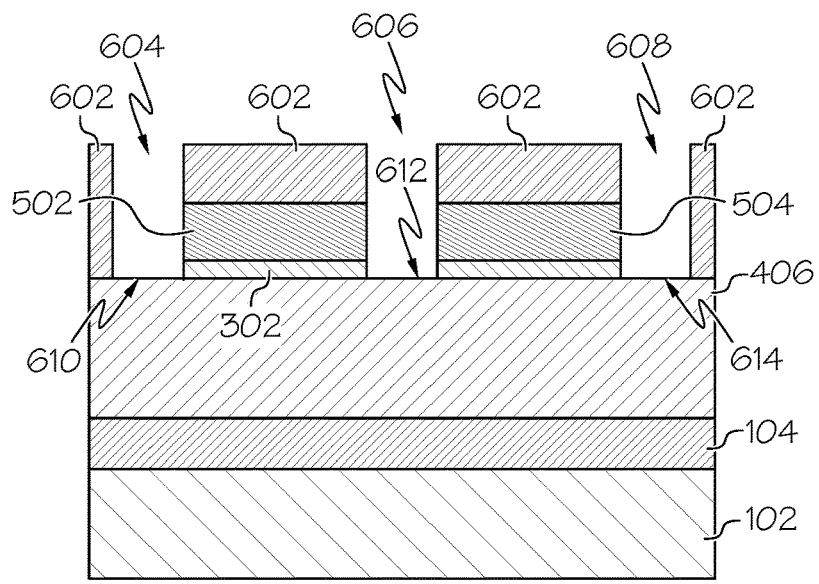
FIG. 6A is a view of the structure shown in FIG. 6 taken along a line that passes through a fin according one embodiment of the present disclosure.
Figure 6B:
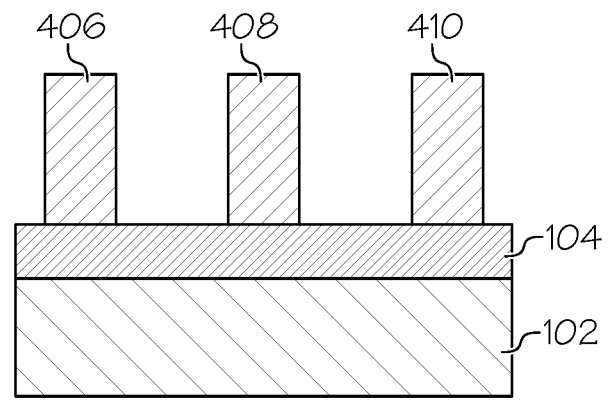
FIGS. 6B and 6C are cross-section views of the structure shown in FIG. 6 taken transverse to the long axis of the fins according one embodiment of the present disclosure.
Figure 6C:
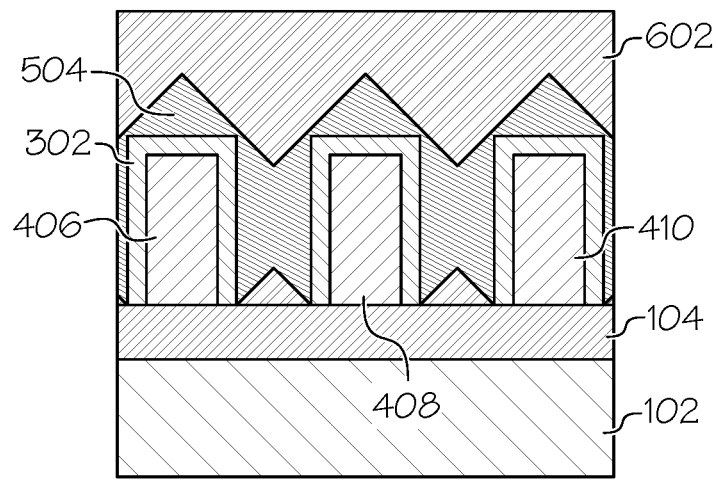
Figure 7:
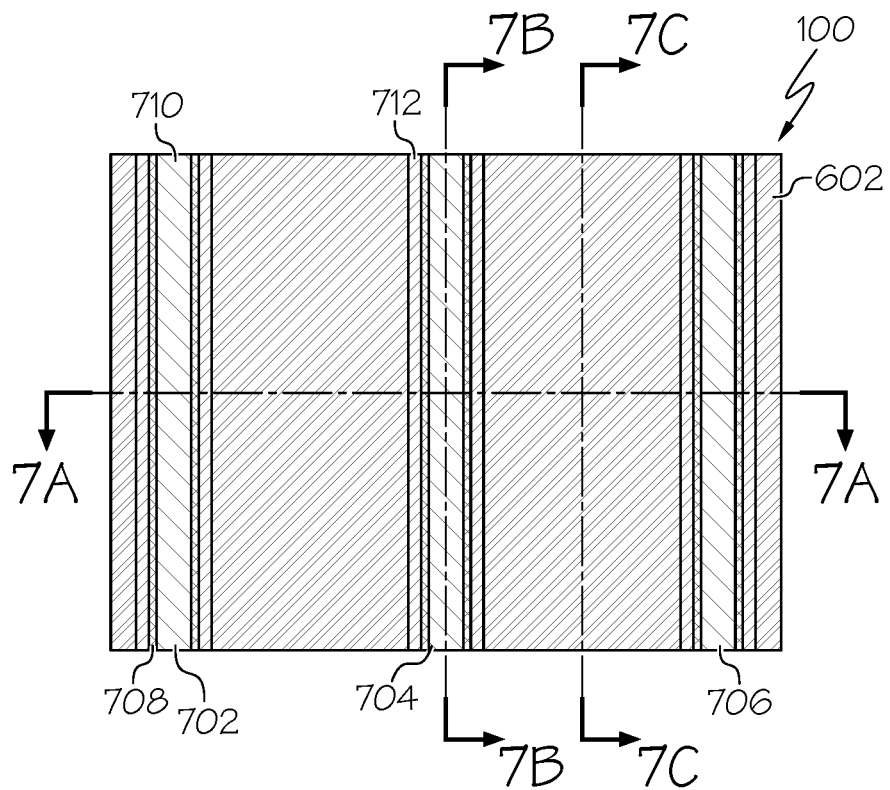
FIG. 7 is a top view of the semiconductor structure after source and drain regions have been formed on each of the plurality of fins according one embodiment of the present disclosure.
Figure 7A:
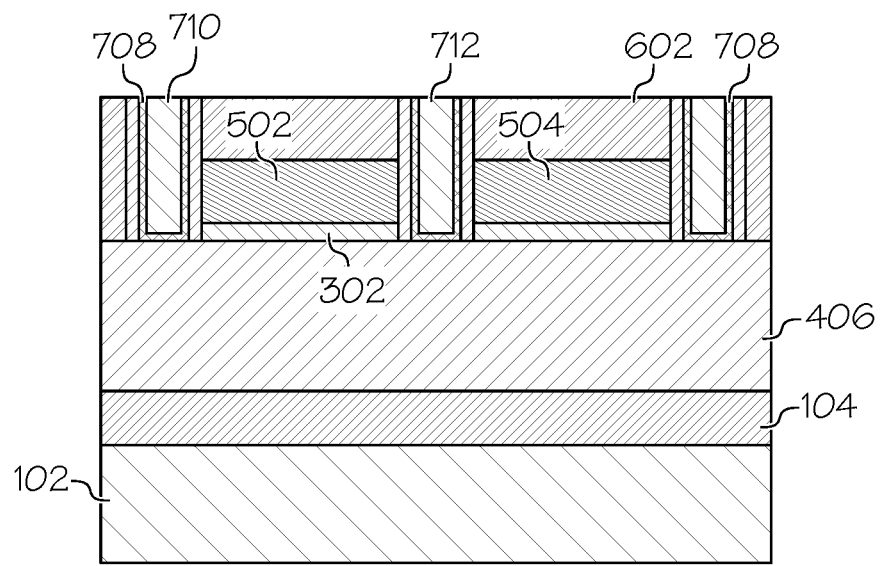
FIG. 7A is a view of the structure shown in FIG. 7 taken along a line that passes through a fin according one embodiment of the present disclosure.
Figure 7B:
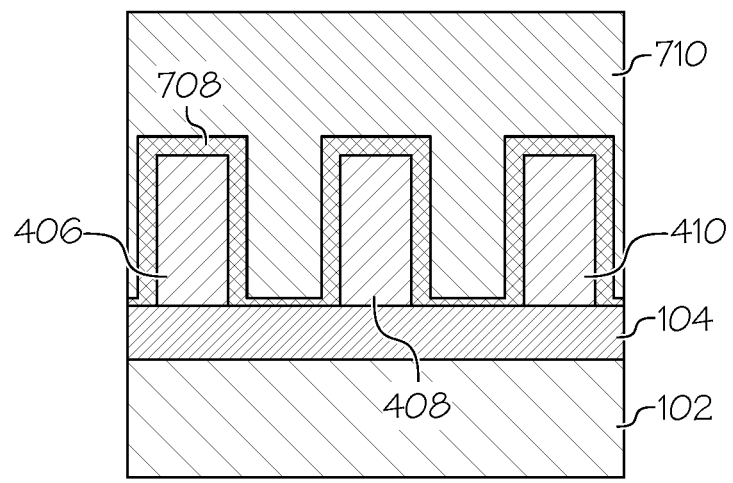
FIGS. 7B and 7C are cross-section views of the structure shown in FIG. 7 taken transverse to the long axis of the fins according one embodiment of the present disclosure.
Figure 7C:
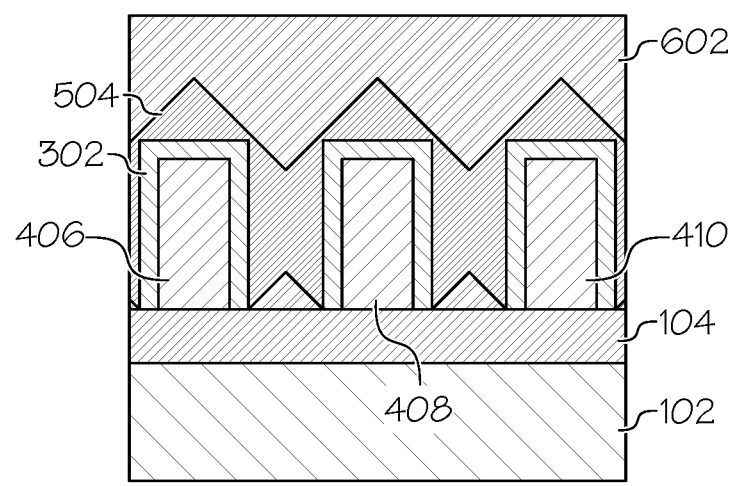

After the source/drain regions 502, 504 have been formed, a dielectric layer 602 is formed over the entire structure 100, as shown in FIG. 6. The dummy gates 202, 204, 206 are then selectively removed with respect to SiGe fins 406, 408, 410 (e.g., via selective etching). This creates trenches 604, 606, 608 within the dielectric layer 602 that exposes the channel regions 610, 612, 614 situated under the dummy gates 202, 204, 206. FIG. 7 shows that one or more gate stacks 702, 704, 706 are then formed on the SiGe fins 406, 408, 410. For example, a thin conformal layer of gate dielectric 708 and thick layers of gate conductor material 710 and optional nitride (not shown) are deposited. The gate dielectric 708 contacts sidewalls of the SiGe fins 406, 408, 410, a top surface of the SiGe fins 406, 408, 410, and a top surface of the underlying dielectric layer 104. The gate conductor 710 contacts sidewalls of the gate dielectric 708, a top surface of the gate dielectric 708 formed on the top surface of the SiGe fins 406, 408, 410, and a top surface of the gate dielectric 708 contacting the top surface of the underlying dielectric layer 104. It should be noted that if sidewall spacers were not formed for the dummy gates, sidewall spacers 712 are formed prior to forming the replacement gates 702, 704, 708. For example, the sidewall spacers 712 can be formed by inner spacer formation process after the dummy gates are removed but prior to high k dielectric and metal gate depositions. Fabrication of the devices, such as forming contacts and forming a dielectric layer(s) over the device, can then be completed utilizing one or more processes known the industry.

Figure 8:
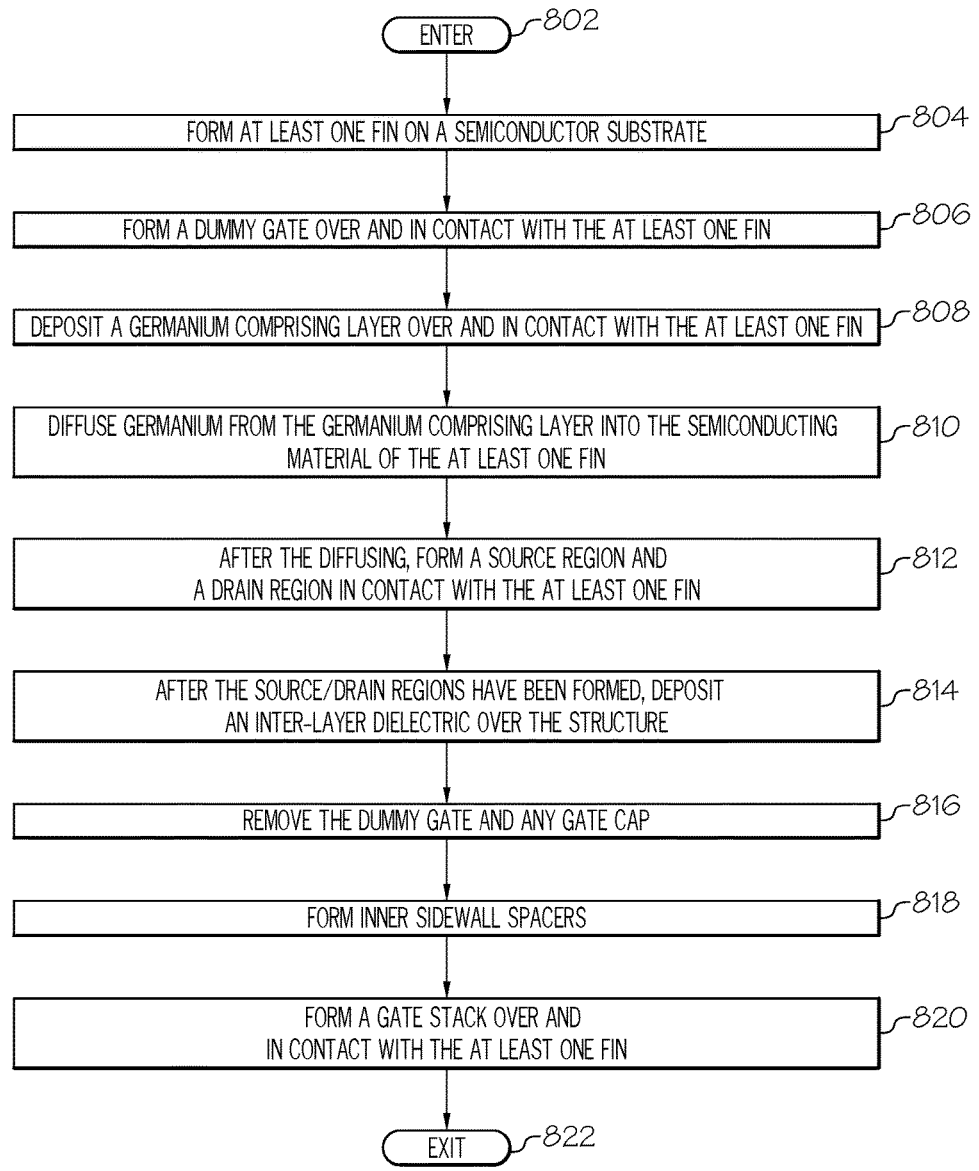
FIG. 8 is an operational flow diagram illustrating one process for fabricating a semiconductor fin structures that are immune to epitaxy defects according one embodiment of the present disclosure.

FIG. 8 is an operational flow diagram illustrating a process for fabricating a semiconductor fin structures that are immune to epitaxy defects. In FIG. 8, the operational flow diagram begins at step 802 and flows directly to step 804. It should be noted that each of the steps shown in FIG. 8 has been discussed in greater detail above with respect to FIGS. 1-7. At least one fin, at step 804, is formed on a semiconductor substrate. A dummy gate, at step 806, is formed over and in contact with the at least one fin. A germanium comprising layer, at step 808, is deposited over and in contact with the at least one fin.

Germanium, at step 810, is diffused from the germanium comprising layer into the semiconducting. After the diffusing, a source region and a drain region with in contact with the at least one fin at step 812. Then, an inter-layer dielectric material is deposited followed by the CMP process, stopping on gate cap layer, at step 814. Gate cap and dummy gates, at step 816, are then removed. After the gates have been removed, inner sidewall spacers are formed if no sidewall spacers on removed dummy gates, at step 818. If the sidewall spacers have already been formed during the dummy gate formation process, the pre-formed sidewall spacers will stay intact after the dummy gates are removed. A gate stack is formed over and in contact with the at least one fin, at step 820. The control flow then exit at step 822.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also that these embodiments are only examples of the many advantageous uses of the innovative teachings herein.

In general, statements made in the specification of the present application do not necessarily limit any of the various claimed disclosures. Moreover, some statements may apply to some inventive features but not to others.

What is claimed is:

1. A method of forming a semiconductor structure, the method comprising:
    forming at least one fin on a semiconductor substrate, the least one fin comprising a semiconducting material;
    forming a gate over and in contact with the at least one fin, wherein the gate is a dummy gate;
    depositing a germanium comprising layer over and in contact with an exposed top surface the at least one fin;
    diffusing germanium from the germanium comprising layer into the semiconducting material of the at least one fin;
    after the diffusing, removing the dummy gate;
    after removing the dummy gate, forming a gate stack over and in contact with the at least one fin; and
    after forming the gate stack, forming a source region and a drain region in contact with the at least one fin, wherein forming the source region and the drain region comprises
        epitaxially growing a semiconductor material on at least sidewalls of the at least one fin, and
        forming the source region and the drain region in the at least one epitaxially grown semiconductor material.

2. The method of claim 1 wherein forming the gate stack comprises: forming a dielectric layer over and in contact with the at least one fin.

3. The method of claim 2, wherein forming the gate stack further comprises:
    after forming the gate dielectric layer, forming a gate conductor layer over and in contact with the gate dielectric layer.

4. The method of claim 3, further comprising:
    forming a spacer layer on sidewalls of the gate stack.

5. The method of claim 1, further comprising: after forming the gate stack, forming a source region and a drain region in contact with the at least one fin.

6. The method of claim 1, further comprising: forming a spacer layer in contact with the dummy gate, wherein the gate stack is formed in contact with the spacer layer after the dummy gate has been removed.

7. The method of claim 1, further comprising:
    forming a nitride layer on an in contact with the gate.

8. The method of claim 1, wherein the germanium comprising layer is deposited prior to forming the source region and the drain region.

* * * * *